United States Patent
Shibata

(10) Patent No.: US 7,358,618 B2
(45) Date of Patent: Apr. 15, 2008

(54) SEMICONDUCTOR DEVICE AND MANUFACTURING METHOD THEREOF

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/608,016

(22) Filed: Jun. 30, 2003

(65) Prior Publication Data

US 2004/0021234 A1 Feb. 5, 2004

(30) Foreign Application Priority Data

Jul. 15, 2002 (JP) ............................. 2002-206168
Aug. 7, 2002 (JP) ............................. 2002-230484

(51) Int. Cl.
*H01L 23/29* (2006.01)

(52) U.S. Cl. ...................... 257/791; 257/789; 257/787; 257/790; 257/737; 257/738; 257/778; 257/780; 257/736; 257/748; 257/750; 257/E23.021; 257/E23.023; 257/E23.02

(58) Field of Classification Search ............... 257/690, 257/737, 738, 772, 778, 779, 780, 791, 789, 257/787, 783, 790, 736, 748, 750, E23.021, 257/E23.023, E23.02; 438/612, 613
See application file for complete search history.

(56) References Cited

U.S. PATENT DOCUMENTS

| | | | | |
|---|---|---|---|---|
| 5,525,838 A * | 6/1996 | Kaneko | ...................... | 257/778 |
| 5,925,936 A * | 7/1999 | Yamaji | ....................... | 257/787 |
| 6,147,374 A * | 11/2000 | Tanaka et al. | ............... | 257/295 |
| 6,260,264 B1 | 7/2001 | Chen et al. | | |
| 6,281,046 B1 * | 8/2001 | Lam | ........................... | 438/113 |
| 6,376,916 B1 * | 4/2002 | Hosono et al. | ............. | 257/778 |
| 6,404,049 B1 * | 6/2002 | Shibamoto et al. | ......... | 257/712 |
| 6,476,503 B1 | 11/2002 | Imamura et al. | ............ | 257/780 |
| 6,627,997 B1 * | 9/2003 | Eguchi et al. | ............... | 257/777 |
| 6,639,315 B2 * | 10/2003 | Kazama et al. | ............. | 257/738 |
| 6,730,595 B2 * | 5/2004 | Saimoto et al. | ............ | 438/654 |
| 6,897,566 B2 | 5/2005 | Su | | |
| 2001/0010945 A1 | 8/2001 | Miyazaki | | |
| 2002/0041013 A1 * | 4/2002 | Wakamiya et al. | ......... | 257/678 |
| 2002/0047200 A1 | 4/2002 | Bai | | |
| 2002/0056741 A1 * | 5/2002 | Shieh et al. | ............. | 228/180.5 |
| 2002/0072151 A1 * | 6/2002 | Amami et al. | .............. | 438/108 |
| 2005/0167808 A1 * | 8/2005 | Sasaki et al. | ............... | 257/678 |

FOREIGN PATENT DOCUMENTS

| | | |
|---|---|---|
| JP | 11-150090 | 6/1999 |
| JP | 2001-217340 | 8/2001 |
| JP | 2002-118199 | 4/2002 |

\* cited by examiner

*Primary Examiner*—Junghwa M. Im
(74) *Attorney, Agent, or Firm*—Rabin & Berdo, P.C.

(57) ABSTRACT

A semiconductor device having a semiconductor substrate, at least one of a protruding electrode and wiring formed on one surface of the semiconductor substrate, and a first resin film formed on this surface. The first resin film has elasticity low enough to reduce stress induced by a difference in thermal expansion coefficient between the semiconductor substrate and the first resin film. A second resin film, having higher elasticity or higher strength than the first resin film, may be formed on the other surface of the semiconductor substrate.

5 Claims, 4 Drawing Sheets

SEMICONDUCTOR DEVICE AND MANUFACTURING METHOD THEREOF

BACKGROUND OF THE INVENTION

1. Field of the Invention

The present invention relates to a miniaturized, thin semiconductor device and a manufacturing method thereof.

2. Description of Related Arts

In the effort of reducing a semiconductor chip in thickness, there has been performed a backside grinding process for grinding the back surface side of a semiconductor wafer (hereinafter, referred to simply as the wafer) on which elements and wiring are already formed. The backside grinding process is generally performed by laminating a soft protection film on the surface of the wafer, and then by rotating the wafer while pressing the back surface of the water against a grinding wheel with pressure being applied to the wafer through the protection film.

However, during the processes subsequent to the grinding, for example, the dicing process for cutting individual chips away from the wafer and the mounting process for mounting the diced chips onto a lead frame, the wafer and the chips are handled by a robot. Hence, if a reduction in thickness is pursued excessively, breaking occurs in the wafer and the chips when handled, and as a consequence, the yield is lowered. In particular, the diameter of today's wafer is on the increase, and a thin wafer obtained through the backside grinding may brake easily.

In order to solve such a problem, for example, Japanese Laid-Open Patent Publication (KOKAI) No. 11-150090 (1999) proposes the use of a protection reinforcement plate, which is a resin film formed on the surface of the wafer after a group of protruding electrodes are formed on the surface of the wafer. According to the manufacturing method of a semiconductor device of this publication, the backside grinding is applied to the wafer after the resin film is formed, and further, the top portion of the group of protruding electrodes is exposed by removing the surface layer portion of the resin film through etching. Subsequently, the resin film is removed along scribing lines, and further, a nitride film to be used as a passivation film is formed in a region avoiding the protruding electrodes, after which the wafer is cut along the scribing lines and divided into individual chips.

According to this method, the wafer after the backside grinding is reinforced by the resin film, and the individual chips cut away from the wafer are reinforced by the resin film as well. It is thus possible to handle the wafer and the chips in a satisfactory manner without causing any breaking. In addition, because mounting of the chips can be achieved by connecting the exposed top portion of the protruding electrodes to electrode pads on a wiring board, the semiconductor device can be reduced in thickness markedly in comparison with an arrangement such that an external terminals are drawn through wire bonding.

The above-described manufacturing method of the related art, however, has a problem that, as shown in FIG. 6 exaggeratedly, warping occurs in the wafer during a period since the resin film was formed on the surface of the wafer until the backside grinding is performed due to a difference in thermal expansion/contraction coefficient between the wafer and the resin film. Grinding a wafer having warping with a flat grinding wheel yields a difference in thickness between the central region and the edge region of the ground wafer, which makes it impossible to obtain semiconductor chips of a uniform thickness. Moreover, the semiconductor chips cut away from the edge portion of the wafer may not be reduced to a target thickness.

Meanwhile, the wafer reduced in thickness is laminated to an adhesive tape called a dicing tape, and then divided into individual pieces in the dicing process. However, because the wafer is cut by a thin grinding wheel (20 to 100 μm) called a blade during the dicing process, flaws called chipping or microcracking occur at the corners of the diced pieces.

The semiconductor substrate in the form of individual pieces is peeled off from the dicing tape by being pushed up with a needle from the back surface of the dicing tape, whereby perfect pieces are obtained. In this instance, however, the needle or the like damages the semiconductor substrate, and deteriorates the quality considerably. Also, the fabricated semiconductor device is exposed at the back surface on the side opposite to the active surface of the semiconductor substrate, and is therefore fragile and less reliable.

Incidentally, a wafer level CSP (Chip Size Package) is obtained by forming redistribution wiring and a sealing resin film sequentially on the active surface of the semiconductor chip on which circuits are formed. The redistribution wiring includes electrode pads, and posts (pillar-shaped electrodes), made of copper (Cu) and penetrating through the resin film, are formed on the electrode pads. A bump material, such as a solder ball, is bonded to the tip end of each post, so that the post can be bonded to the electrode pad or the like on the wiring board through the bump material.

The wafer level CSP is obtained by completing the processes from the formation of the circuits to the formation of the bump material on a semiconductor wafer containing a number of regions corresponding to individual semiconductor chips, and then cutting the semiconductor wafer into individual semiconductor chips. Consequently, the size of the semiconductor device (wafer level CSP) is almost as small as the size of the semiconductor chip.

However, in a case where the semiconductor substrate, such as a semiconductor wafer and a semiconductor chip, is made of silicon, for example, and the resin film is made of epoxy resin, for example, there is a considerable difference in thermal expansion coefficient between the semiconductor substrate and the resin film. Also, the posts made of copper exert considerable bonding strength with respect to the resin film. For these reasons, when the semiconductor substrate and the resin film undergo thermal expansion/contraction during the fabrication sequence or operations of the semiconductor device, the posts together with the resin film cause displacement, and considerable shearing stress is applied to a junction portion between the posts and the electrode pads, which may result in breaking of an electrical connection between the posts and the electrode pads.

In order to avoid such an unwanted event, stress applied to the posts needs to be dispersed by forming higher (longer) posts. However, in the case of forming the posts through plating, because a time needed for the plating is nearly proportional to the length of the posts, it takes a considerable time to form long posts, and as a result, a long manufacturing time is needed for a semiconductor device.

Further, because copper is an element that readily migrates, for example, in a case where the resin film is made of polyimide that readily absorbs moisture, if neighboring posts are formed too close, these posts electrically short-circuit due to migration. Hence, a wide space needs to be secured between neighboring posts, which is a factor that makes miniaturization of the semiconductor device difficult.

SUMMARY OF THE INVENTION

It is therefore an object of the invention to provide a thin semiconductor device with high strength and a manufacturing method of such a semiconductor device by preventing warping in the semiconductor substrate so that the backside grinding process of a semiconductor substrate can be performed in a satisfactory manner, and by enhancing strength of a ground wafer that is lowered due to a reduction in thickness.

Another object of the invention is to provide a semiconductor device arranged in such a manner that miniaturization and a reduction in thickness can be readily achieved.

A further object of the invention is to provide a semiconductor device in which bonding between an electrode pad and a post is hard to break.

Still another object of the invention is to provide a semiconductor device that can be manufactured in a short time.

Still another object of the invention is to provide a semiconductor device in which a plurality of posts can be provided in close proximity to one another.

A semiconductor device according to the first aspect of the invention includes: a semiconductor substrate; at least one of a protruding electrode and wiring formed on one surface of the semiconductor substrate; and a first resin film formed on the surface of the semiconductor substrate, and the first resin film has elasticity low enough to reduce stress induced by a difference in thermal expansion coefficient between the semiconductor substrate and the first resin film.

According to the invention, because the first resin film formed on one surface of the semiconductor substrate is made of a resin film having low elasticity, there will hardly occur warping due to a difference in thermal expansion/contraction between the semiconductor substrate and the resin film. It is thus possible to grind the back surface of the semiconductor substrate homogeneously with the semiconductor substrate being flat. Hence, a semiconductor substrate adjusted to have a uniform, desired thickness can be obtained. In other words, the semiconductor substrate obtained in this manner is reduced in thickness homogeneously in both the central region and the edge region. Hence, by cutting individual semiconductor chips away from the semiconductor substrate, it is possible to obtain thin semiconductor chips of a uniform thickness. Further, warping due to a difference in thermal expansion/contraction between the semiconductor substrate and the resin film will hardly occur in a fabricated semiconductor device, either.

It is preferable to set an elastic modulus of the first resin film to 15 GPa or lower.

According to this arrangement, by setting the elastic modulus of the first resin film to 15 GPa or lower, it is possible to eliminate warping due to a difference in thermal expansion/contraction between the semiconductor substrate and the resin film.

Further, it is preferable to form a second resin film having higher elasticity or higher strength than the first resin film on the other surface of the semiconductor substrate. It is more preferable to set an elastic modulus of the second resin film to 15 GPa or higher. When arranged in this manner, strength of the semiconductor device, which is lowered due to grinding of the back surface of the semiconductor substrate, can be enhanced. It is more preferable that the semiconductor substrate has a thickness of 550 µm or less. It is furthermore preferable to arrange in such a manner that the semiconductor substrate has a thickness of 200 µm or less and is placed at a center of the semiconductor device in a thickness direction of a cross section structure.

A method of manufacturing a semiconductor device of the invention includes: a step of forming at least one of a protruding electrode and wiring on one surface of a semiconductor substrate; a step of forming a first resin film on the semiconductor substrate on the surface on which at least one of the protruding electrode and the wiring is formed, the first resin film having elasticity low enough to reduce stress induced by a difference in thermal expansion coefficient between the semiconductor substrate and the first resin film; a grinding step of reducing the semiconductor substrate in thickness through one of polishing and grinding of the other surface of the semiconductor substrate; a step of forming a second resin film on the other surface subsequent to the grinding step, the second resin film having higher elasticity or higher hardness than the first resin film; and a step of cutting the semiconductor substrate into individual pieces after the second resin film is formed.

According to the invention, because the first resin film formed on one surface of the semiconductor substrate is made of a resin film having low elasticity, there will hardly occur warping due to a difference in thermal expansion/contraction between the semiconductor substrate and the resin film. It is thus possible to grind the back surface of the semiconductor substrate homogeneously with the semiconductor substrate being flat. Hence, a semiconductor substrate adjusted to have a uniform, desired thickness can be obtained through this manufacturing method of a semiconductor device. In other words, the semiconductor substrate obtained in this manner is reduced in thickness homogeneously in both the central region and the edge region. Hence, by cutting individual semiconductor chips away from the semiconductor substrate, it is possible to obtain thin semiconductor chips of a uniform thickness. Further, warping due to a difference in thermal expansion/contraction between the semiconductor substrate and the resin film will hardly occur in a fabricated semiconductor device, either. Moreover, because the second resin film having higher elasticity or higher hardness than the first resin film is formed on the other surface of the semiconductor substrate, strength of the semiconductor device, which is lowered due to grinding of the back surface of the semiconductor substrate, can be enhanced.

A semiconductor device according a second aspect of the invention includes: a semiconductor chip; an electrode pad formed on the semiconductor chip; a resin film formed to cover a surface of the semiconductor chip; and a post bonded to the electrode pad and provided to penetrate through the resin film, a portion of which in close proximity to a junction portion with the electrode pad is made of gold.

According to the invention, a portion of the post in close proximity to the junction portion with the electrode pad is made of gold. Gold is a stable element and does not bond to resin firmly. Hence, in a case where a displacement is caused between the semiconductor chip and the resin film due to a difference in thermal expansion between the semiconductor chip and the resin film, a large force is not applied to the post at the portion made of gold, and therefore, shearing stress applied to the junction portion between the post and the electrode pad is small.

Also, because gold has higher ductility than copper or the like, it readily deforms when stress is applied. According to the invention, the portion that is in close proximity to the junction portion with the electrode pad and is thereby most susceptible to large stress is made of gold, and it is therefore possible to relieve stress efficiently through deformation of the above portion. For these reasons, bonding between the electrode pad and the post is hard to break.

Such an advantage can be achieved in the fabrication sequence of a semiconductor device as well. To be more concrete, in the case of manufacturing a semiconductor device by forming the resin film on the semiconductor wafer containing a number of regions corresponding to the semiconductor chips, stress is reduced which is applied to the junction portion between the post and the electrode pad when the semiconductor wafer and the resin film undergo thermal expansion/contraction.

Hence, it is not necessary to make the post longer in reducing stress applied to the junction portion between the post and the electrode pad. To be brief, the post can be lower (shorter). Hence, in the case of forming the post through plating, a time needed for the plating can be shorter. That is to say, the semiconductor device described as above can be manufactured in a short time.

Further, because gold hardly migrates in comparison with copper, even when a plurality of posts made of gold are provided in close proximity, these posts will not be electrically short-circuited due to migration. Hence, the posts can be provided in close proximity to one another, which enables miniaturization of the semiconductor device.

The entire post may be made of gold or only the portion in close proximity to the junction portion with the electrode pad may be made of gold.

Also, the post may include a portion made of a metal material other than gold. In particular, by using a metal material less expensive than gold, the cost can be saved by using a smaller quantity of expensive gold.

Also, a bump member, such as a solder ball, may be bonded to the tip end (the end portion on the opposite side to the junction portion with the electrode pad) of the post, and the semiconductor device may be bonded to another wiring board or the like through the bump member. In this instance, large stress may possibly be induced between the bump member and the post. In this case, however, it may be arranged in such a manner that a portion of the post in close proximity to the junction portion with the bump member is made of gold. It is thus possible to reduce stress applied to the junction portion with the bump member as with the junction portion with the electrode pad.

The post may include, for example, a junction portion provided on a side of the electrode pad and made of gold, a tip end portion provided on a side of a tip end and made of gold, and an intermediate portion provided between the junction portion and the tip end portion and made of a metal material other than gold.

It is preferable that the intermediate portion is made of a metal material less expensive than gold in saving the cost, and for example, it may be made of copper.

The above and other objects, features, and advantages of the invention will become more apparent from the following description of embodiments with reference to the accompanying drawings.

DESCRIPTION OF THE PREFERRED EMBODIMENTS

Figure 1A:
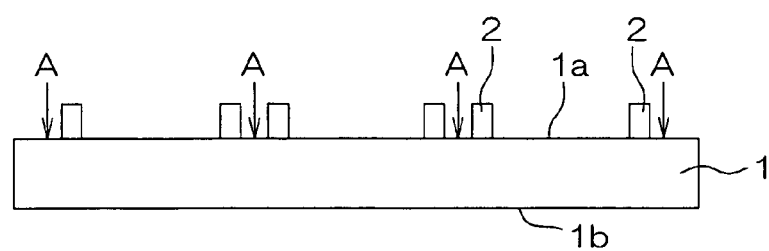
FIG. 1(*a*) through FIG. 1(*f*) are schematic cross sections showing a step-by-step manufacturing method of a semiconductor device according to a first embodiment of the invention.
Figure 1B:
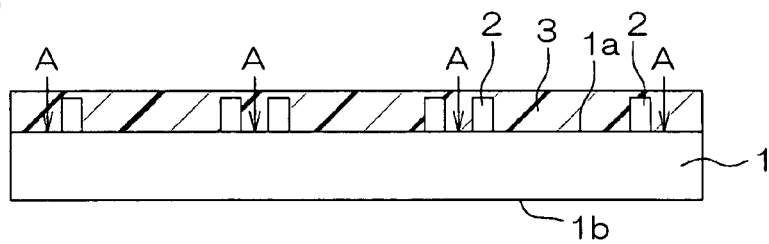
Figure 1C:
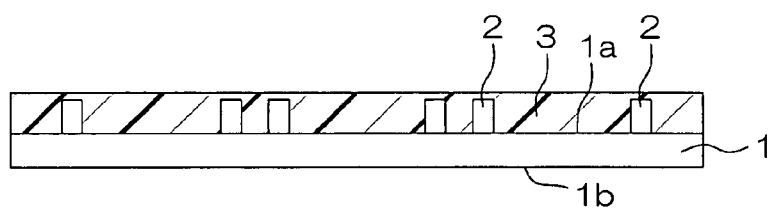

FIGS. 1(*a*) through 1(*f*) are schematic cross sections showing a step-by-step manufacturing method of a semiconductor device according to a first embodiment of the invention. A semiconductor wafer 1 (hereinafter, referred to simply as the wafer 1) of the drawings has undergone the forming process of various elements and the wiring process, and a surface 1*a*, which is a surface on an active surface layer region side, is covered with a passivation film made of a nitride film or the like. Pads used to establish an external electrical connection are exposed from the passivation film.

As shown in FIG. 1(*a*), a plurality of protruding electrodes 2 made of gold (Au), for example, are formed on the pads. The protruding electrodes 2 are formed, for example, through electrolytic plating, and it is preferable to set a height thereof from the surface of the passivation film to 50 μm approximately. The protruding electrodes 2 are preferably shaped like a pillar, such as a cylindrical pillar and a prismatic pillar. Besides gold, the protruding electrodes 2 may be made of copper, solder, etc. Also, scribing lines are formed at the boundaries (at the positions indicated by arrows A in FIGS. 1(*a*) and 1(*b*)) among the individual semiconductor elements on the surface 1*a* of the wafer 1.

Then, a first resin film 3 is formed on the surface 1*a* of the wafer 1 (FIG. 1(*b*)). The first resin film 3 can be obtained by applying a liquid of resin through the screen printing method, the spin coating method, the bar coating method, etc. followed by curing. The resin to be used may be polyimide, epoxy resin or the like. It is preferable to form the cured first resin film 3 (hereinafter, referred to simply as the first resin film 3) thick enough to bury the protruding electrodes 2. To be more specific, a thickness of the first resin film 3 is preferably 100 μm approximately. It is also preferable that the surface of the first resin film 3 is flat. In addition, it is preferable that the first resin film 3 has elasticity low enough to reduce stress induced by a difference in thermal expansion coefficient between the semiconductor substrate and the first resin film 3, and to be more specific, it is preferable that the first resin film 3 has an elastic modulus of 15 GPa or lower, in particular, 5 GPa or lower.

Subsequently, the back surface 1*b* of the wafer 1 on which is formed the first resin film 3 described as above is subjected to grinding through the use of a grinder, and the wafer 1 is adjusted to have a desired thickness (FIG. 1(*c*)). In a case where the first resin film 3 is formed so as to cover the top portion of the protruding electrodes 2 and the surface of the first resin film 3 is flat, because the first resin film 3 has the elasticity low enough to reduce the stress induced by a difference in thermal expansion coefficient between the first resin film 3 and the semiconductor substrate, it is possible to pressurize the wafer 1 homogeneously at the time of grinding from the side where the first resin film 3 is formed.

Figure 1D:
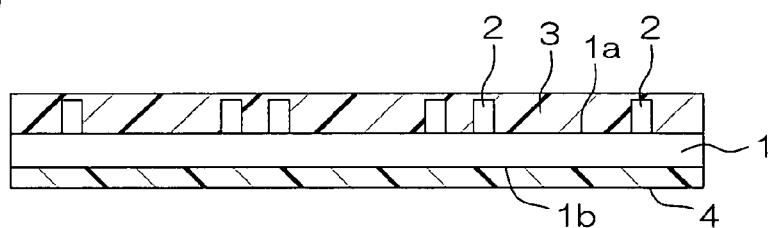
Figure 1E:
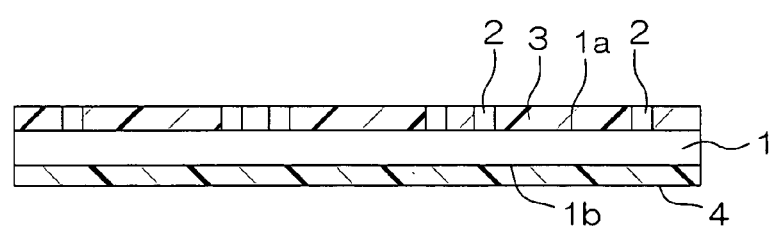
Figure 1F:
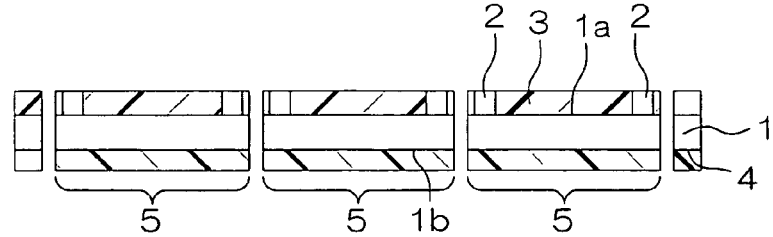

Subsequently, a second resin film 4 is formed on the ground back surface side of the semiconductor substrate (FIG. 1(d)). The second resin film 4 can be obtained by applying a liquid of resin through the screen printing method, the spin coating method, the bar coating method, etc. followed by curing. The resin to be used may be polyimide, epoxy resin or the like. The second resin film 4 is made of resin having higher elasticity or higher strength than the first resin film 3. It is preferable that the second resin film 4 has an elastic modulus of 15 GPa or higher, in particular, 20 GPa or higher.

Figure 2:
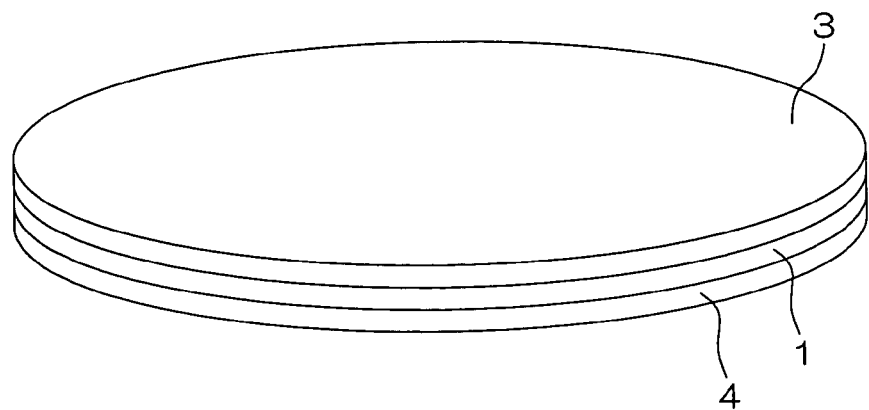
FIG. 2 is a schematic perspective view showing a first resin film, a second resin film, and a semiconductor substrate.

FIG. 2 is a perspective view showing the entire wafer 1 on which the first resin film 3 and the second film 4 as described above are formed.

Subsequently, the wafer 1 is subjected to grinding through the use of a grinder on the surface on which the protruding electrodes 2 or wiring is provided with the first resin film 3 being formed atop, so that the protruding electrodes 2 are exposed by adjusting the first resin film 3 to have a desired thickness.

Subsequently, the wafer 1 on which are formed the first resin film 3 and the second resin film 4 described as above is laminated to a tape called a dicing tape, and the cutting process called dicing is performed to cut and divide the wafer 1 into individual pieces. In this instance, an adhesion force (bonding strength) of the dicing tape prevents scattering of the pieces. It does not matter whether the wafer 1 is laminated to the dicing tape on the electrode surface (the first resin film 3) or on the opposite side (the second resin film 4). However, it is preferable to laminate the second resin film 4 to the dicing tape because damages at the time of peeling can be prevented.

As has been described, according to this embodiment, because the first resin film 3 formed on the surface 1a of the wafer 1 is made of resin having low elasticity, there will occur no warping due to a difference in thermal expansion/contraction between the wafer 1 and the first resin film 3. Hence, the wafer 1 is flat when the grinding process (FIG. 1(d)) is performed, and it is thus possible to grind the back surface 1b of the wafer 1 homogeneously in all the portions of the wafer 1.

Also, the wafer 1 is reinforced entirely by the first resin film 3 formed on the surface 1a of the wafer 1 during the grinding process. Hence, the wafer 1 can be subjected to grinding in a satisfactory manner without causing breaking in the wafer 1, which makes this embodiment advantageous in making the wafer 1 in the form of a thin film.

In addition, because the wafer 1 is reinforced by the first resin film 3 and the second resin film 4 when the wafer 1 is handled or when the wafer 1 is cut by a dicing blade in the dicing process, there is no possibility that breaking occurs in the wafer 1 or the semiconductor chips 5. Hence, it is possible to reduce the wafer 1 to a desired thickness, which in turn contributes to a reduction of the semiconductor chip 5 in thickness.

Figure 3:
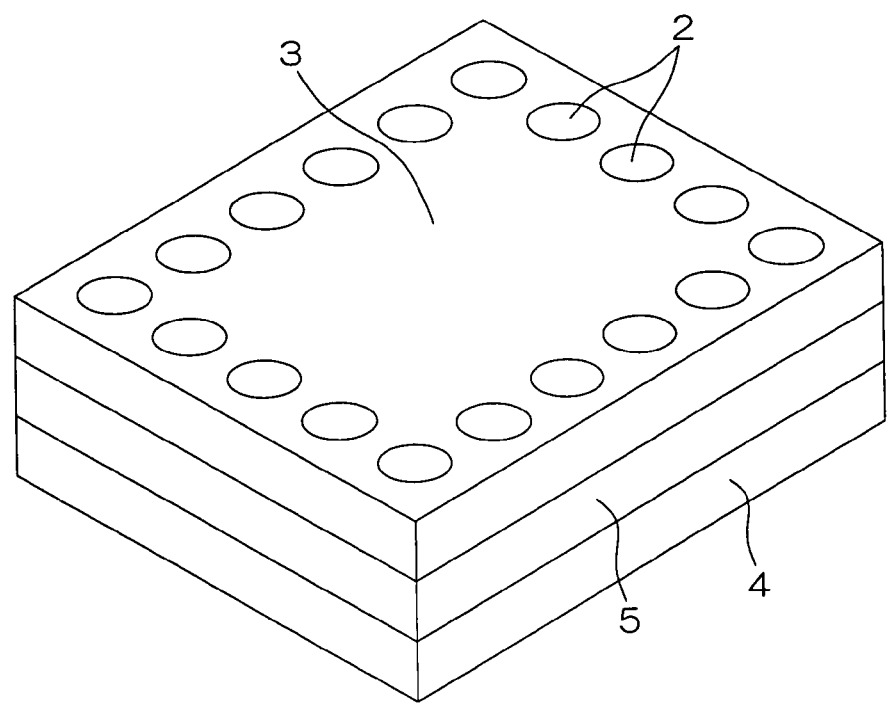
FIG. 3 is a schematic perspective view showing a semiconductor chip manufactured by the above manufacturing method.

In the final form of the semiconductor chip 5 shown in FIG. 3, the semiconductor substrate is protected and reinforced by two kinds of resin on the respective surfaces. In other words, the surface 1a (active surface) of the wafer 1 is protected by the first resin film 3, and the back surface 1b is also reinforced and protected by the second resin film 4 having high elasticity or high hardness. Also, because the protruding electrodes 2 are exposed, no further packaging is necessary for the semiconductor chips 5. It is thus possible to obtain a semiconductor package reduced both in size and thickness while having extremely high quality and strength. The semiconductor packages (semiconductor chips 5) as described above can be mounted on the electrode pads formed on the wiring substrate with the exposed protruding electrodes 2 being faced down.

The above embodiment describes a case where the protruding electrodes 2 are formed after wiring is formed on one surface of the semiconductor substrate 1. However, either wiring or the protruding electrodes 2 alone may be formed and connected to external terminals. Even in a case where the protruding electrodes 2 are not formed, part of the wiring may be exposed from the first resin film 3 to be connected to the electrode pads on the wiring board.

Figure 4:
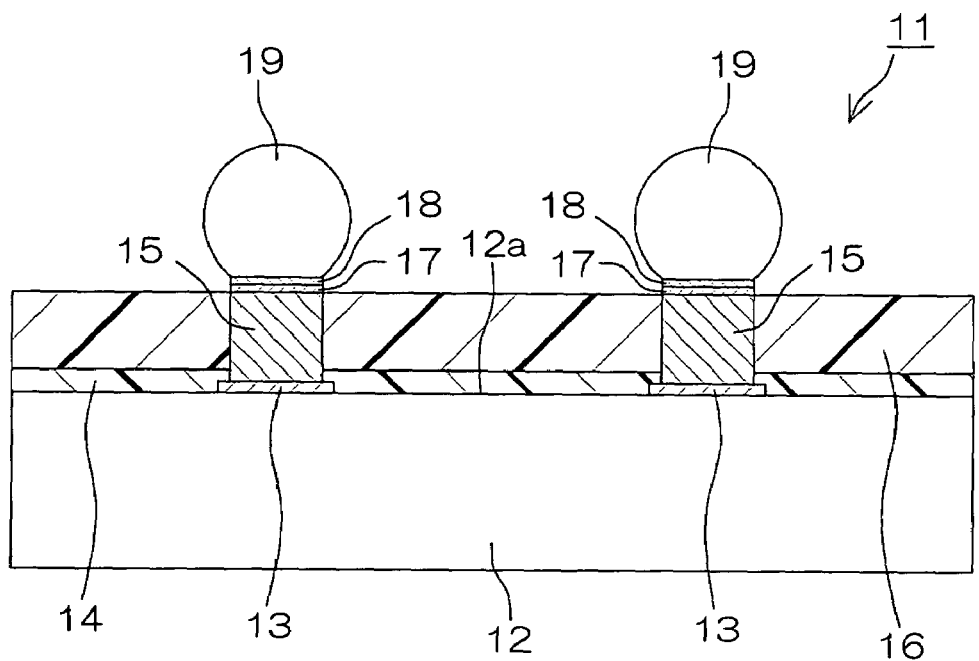
FIG. 4 is a schematic cross section showing a semiconductor device according to a second embodiment of the invention.

FIG. 4 is a schematic cross section showing a semiconductor device 11 according to a second embodiment of the invention.

The semiconductor device 11 includes a semiconductor chip 12. In the semiconductor chip 12, redistribution wiring including electrode pads 13 is formed on an active surface 12a on which circuits are formed. The electrode pads 13 are made of copper (Cu). A passivation film 14 is formed on the redistribution wiring in such a manner that the electrode pads 13 are exposed. A resin film 16 is formed on the passivation film 14.

A post (for example, a cylindrical pillar-shaped electrode) 15 made of gold (Au) is bonded to each electrode pad 13 almost vertically. The posts 15 are provided to penetrate through the resin film 16. A nickel (Ni) layer 17 is formed on the tip end (on the opposite side to the junction portion with the electrode pad 13) of each post 15, and a thin gold flash layer 18 (for example, a thickness of 0.5 μm approximately) is formed on the nickel layer 17 to prevent oxidation of the nickel layer 17. Solder balls 19 used as a bump material are bonded onto the gold flash layer 18.

The semiconductor device 11 can be bonded to electrode pads or the like on a wiring board by fusing the solder balls 19. In this instance, although the gold flash layer 18 is dispersed in solder, gold forming the posts 15 is blocked by the nickel layer 17 and is there by prevented from being diffused into solder.

The semiconductor device 11 is a so-called wafer level CSP (Chip Size Package), and all the processes from the formation of circuits to the bonding of the solder balls 19 are performed on a semiconductor wafer containing a number of regions corresponding to the semiconductor chips 12. A semiconductor device 11 can be obtained by cutting individual semiconductor chips 12 away from the semiconductor wafer as described above. For this reason, the size of the semiconductor device 11 (package) is almost as small as the size of the semiconductor chip 12.

In a case where the semiconductor chip 12 is made of silicon (Si), for example, and the resin film 16 is made of epoxy resin, for example, there is a considerable difference in thermal expansion coefficient between the semiconductor chip 12 and the resin film 16. Hence, when the semiconductor chip 12 and the resin film 16 undergo thermal expansion/contraction, considerable shearing stress is exerted between the semiconductor chip 12 and the resin film 16.

However, because the posts 15 made of gold have small bonding strength with respect to the resin film 16, a large force is not applied to the posts 15 from the resin film 16. Also, because gold has higher ductility than copper or the like, it readily deforms when stress is applied. Hence, the posts 15 deform in such a manner so as to relieve the stress.

Further, because gold and copper have good adhesion, the posts 15 have high bonding strength with respect to the electrode pads 13.

For these reasons, large shearing stress is not applied to the junction portion between the posts 15 and the electrode pads 13, which makes bonding between the posts 15 and the electrode pads 13 hard to break.

Such an advantage can be achieved in the fabrication sequence of the semiconductor device 11 as well. To be more concrete, in the case of manufacturing the semiconductor device 11 by forming the resin film 16 on a semiconductor wafer containing a number of regions corresponding to the semiconductor chips 12, stress applied to the junction portion between the posts 15 and the electrode pads 13 when the semiconductor wafer and the resin film 16 undergo thermal expansion/contraction is reduced.

Hence, it is not necessary to disperse stress applied to the posts 15 by making the posts 15 longer (by increasing the height of the posts 15 from the electrode pads 13). In other words, the posts 15 can be shorter (the height of the posts 15 from the electrode pads 13 can be lower). In the case of forming the posts 15 through plating, because a time needed to form the posts 15 is nearly proportional to the length of the posts 15, the posts 15 can be formed in a shorter time in this case, which in turn makes it possible to shorten a manufacturing time of the semiconductor device 11.

Also, because gold has a property that it hardly migrates, even when spaces between neighboring posts 15 are narrowed, these posts 15 will not be electrically short-circuited. Hence, even when the resin film 16 is made of resin that readily absorbs moisture, such as polyimide, the space between neighboring posts 15 can be narrowed, which enables further miniaturization of the semiconductor device 11.

Figure 5:
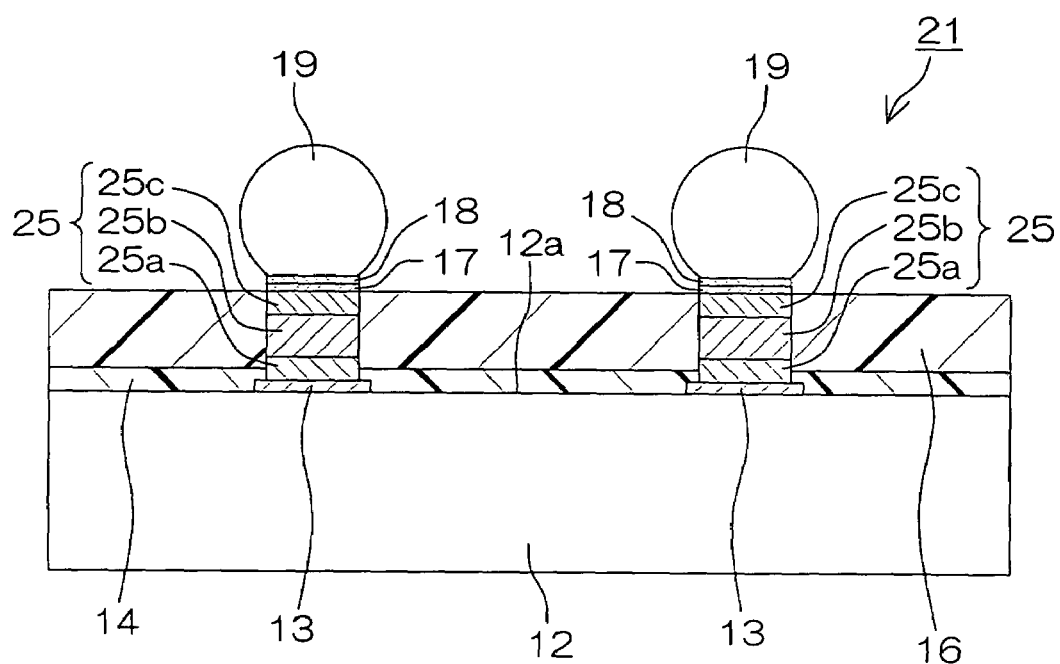
FIG. 5 is a schematic cross section showing a semiconductor device according to a third embodiment of the invention.
Figure 6:
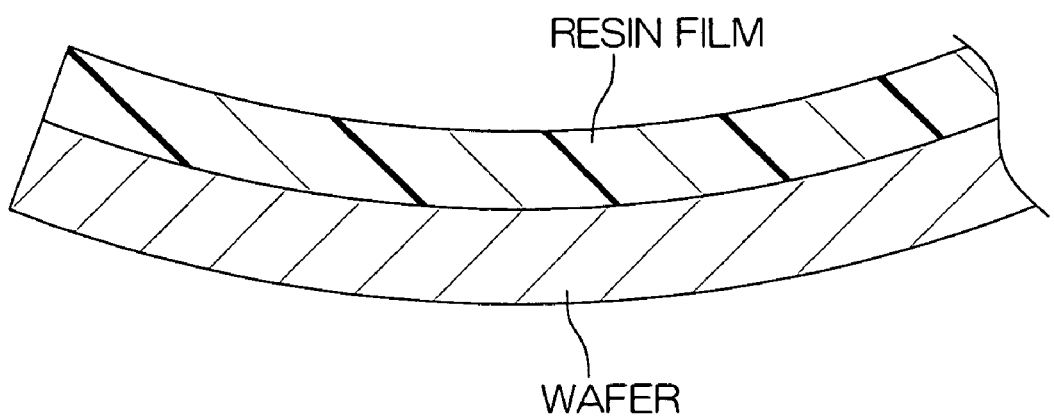
FIG. 6 is a schematic view used to explain a problem of warping that occurs when an ordinary resin film is formed on one surface of a wafer.

FIG. 5 is a schematic cross section showing a semiconductor device 21 according to a third embodiment of the invention. Portions having the same arrangements as those of the semiconductor device 11 of the second embodiment shown in FIG. 4 will be labeled with the same numerical references and an explanation of these portions is omitted for ease of explanation.

Each post 25 includes a lower junction portion 25a in close proximity to the junction portion with the electrode pad 13, an upper junction portion 25c in close proximity to the tip end (the junction portion with the solder ball 19 through the nickel layer 17 and the gold flash layer 18), and an intermediate portion 25b between the lower junction portion 25a and the upper junction portion 25c. The lower junction portion 25a and the upper junction portion 25c are made of gold, and the intermediate portion 25b is made of copper.

In this embodiment, of the entire post 25, the lower junction portion 25a that is most susceptible to stress induced by a difference in thermal expansion between the semiconductor chip 12 and the resin film 16 is made of gold, so that stress can be relieved efficiently through deformation of the lower junction portion 25a.

Also, large stress may possibly be applied to the upper junction portion 25c close to the solder ball 19 used for external electrical connection. However, because the upper junction portion 25c is also made of gold, stress can be relieved through deformation of the upper junction portion 25c.

Because the intermediate portion 25b almost unsusceptible to stress is made of inexpensive copper, the post 25 is less expensive than the post 15 made of gold entirely. This can reduce the cost of the semiconductor device 21.

In a case where large stress is not applied to the upper junction portion 25c, the upper junction portion 25c may be made of copper or the like.

While the above description described embodiments of the invention in detail, it should be appreciated that these embodiments represent examples to provide clear understanding of the technical contents of the invention, and the invention is not limited to these examples. The sprit and the scope of the invention, therefore, are limited solely by the scope of the appended claims.

This application is based on Application Nos. 2002-206168 and 2002-230484 filed with the Japanese Patent Office on Jul. 15, 2002 and Aug. 7, 2002, respectively, the entire content of which is incorporated hereinto by reference.

What is claimed is:

1. A semiconductor device, comprising:
   a semiconductor chip;
   an electrode pad formed on the semiconductor chip;
   a resin film formed to cover a surface of the semiconductor chip;
   a post bonded to the electrode pad and provided to penetrate through the resin film, a first portion of which in close proximity to a junction portion with the electrode pad is made of gold; and
   a passivation layer on the surface of the semiconductor chip, between the semiconductor chip and the resin film and covered by the resin film so as to have a passivation film/resin film interface therewith, the gold portion of the post including a portion facing the passivation film/resin film interface, the first portion of the post in direct contact with the passivation film/resin film interface, a second portion of the post made of a metal material other than gold being separated from the passivation film/resin film interface by the first portion.

2. The semiconductor device according to claim 1, wherein the post includes a junction portion provided on a side of the electrode pad and made of gold, a tip end portion provided on a side of a tip end and made of gold, and an intermediate portion provided between the junction portion and the tip end portion and made of a metal material other than gold.

3. The semiconductor device according to claim 1, wherein the passivation layer has a thickness greater than a thickness of the electrode pad and the gold first portion of the post projects below a surface of passivation layer at the passivation film/resin film interface into direct contact with the electrode pad.

4. The semiconductor device according to claim 1, wherein the passivation layer has a thickness greater than a thickness of the electrode pad and the gold first portion of the post projects below a surface of passivation layer at the passivation film/resin film interface into confrontation with the electrode pad.

5. The semiconductor device according to claim 1, wherein the gold first portion of the post is in direct contact with the electrode pad.

* * * * *